United States Patent [19]

Peterson

[11] Patent Number: 5,134,404
[45] Date of Patent: Jul. 28, 1992

[54] QUADRATURE ERROR CORRECTION

[75] Inventor: Robert A. Peterson, Pittsburgh, Pa.

[73] Assignee: Aerotech, Inc., Pittsburgh, Pa.; a part interest

[21] Appl. No.: 678,682

[22] Filed: Apr. 1, 1991

[51] Int. Cl.[5] .......................................... H03M 1/64
[52] U.S. Cl. .................................... 341/116; 341/112; 318/605
[58] Field of Search .............. 341/111, 112, 113, 114, 341/115, 116, 118, 120; 318/661, 632, 608, 604, 605

[56] References Cited

U.S. PATENT DOCUMENTS

| | | | |
|---|---|---|---|
| 4,075,698 | 2/1978 | Lode | 341/111 X |
| 4,352,050 | 9/1982 | Sakano | 318/661 |
| 4,472,669 | 9/1984 | Denham et al. | 318/661 |
| 4,482,855 | 11/1984 | Otsuka et al. | 318/809 |
| 4,792,739 | 12/1988 | Nakamura et al. | 318/661 |
| 4,992,716 | 2/1991 | Ellis | 318/661 |

Primary Examiner—Howard L. Williams
Assistant Examiner—Brian Young
Attorney, Agent, or Firm—Webb, Burden, Ziesenheim & Webb

[57] ABSTRACT

A method of correcting quadrature signal errors comprises the steps for generating an error function signal E by summing the squares of the quadrature signals and subtracting a constant K therefrom, saving the value of the error function E at $\theta$ equals approximately 0, $\pi/2$, $\pi$, and $3\pi/2$, using the saved values of the error function to generate signals indicative of the quadrature errors, and generating corrected quadrature signals by processing the quadrature signals to eliminate the errors.

14 Claims, 8 Drawing Sheets

FIG. 9(a) INPUT COSINE PHASE ERROR 0.4R

FIG. 9(b) ERROR SIN2+COS2-1

FIG. 9(c) CORRECTED COSINE

FIG. 9(d) PHASE CORRECTION dPe

FIG. 10(a) INPUT SINE Ks = 0.7

FIG. 10(b) ERROR SIN2+COS2-1

FIG. 10(c) CORRECTED SINE

FIG. 10(d) SCALE FACTOR CORRECTION dKse

QUADRATURE ERROR CORRECTION

BACKGROUND OF THE INVENTION

Figure 1:
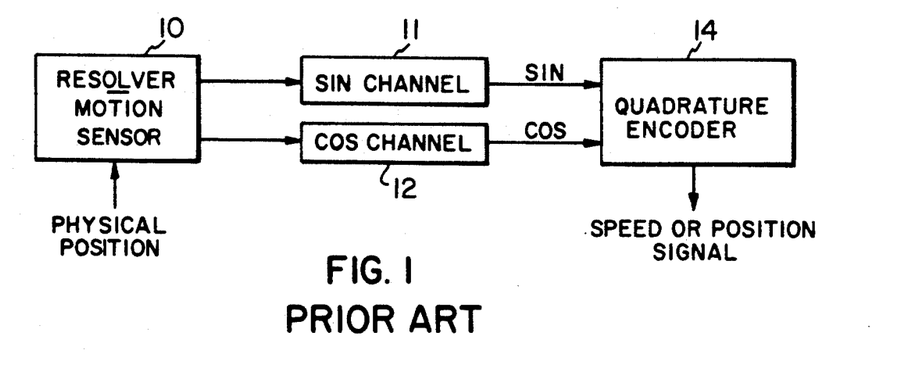
FIG. 1 is a schematic illustration of a quadrature encoder system according to the prior art.

Referring to FIG. 1, there is shown a quadrature encoder system in which a resolver or like position sensor produces two sinusoidal signals in quadrature (90 spatial degrees out-of-phase). The frequency of the signals is proportional to the rate of change of position. The direction of the change in position may be determined from the lead-lag relationship of the two signals. The two signals are processed in separate channels (the SIN channel and the COS channel) and applied to the quadrature encoder which generates a speed and/or position signal. An important advantage of the quadrature encoder is that it can determine the direction of change in position. There are numerous techniques for encoding the quadrature signals including tracking loops, arc tangent encoding and phase encoding. Each of these techniques suffers from a sensitivity to amplitude, phase and bias errors in the quadrature signals.

A typical application of a quadrature encoder system is in the control of machine elements. Properly encoded position information can enable determination whether a shaft or other machine element is operating properly. In addition, knowledge of the position of the shaft or other machine element enables closed loop (feedback) control of the machine element.

A resolver is a transducer device which monitors the position of a rotatable shaft. A linear displacement detector is a transducer which monitors the linear displacement of a machine element or the like. Quadrature encoding systems apply equally to both.

Figure 2:
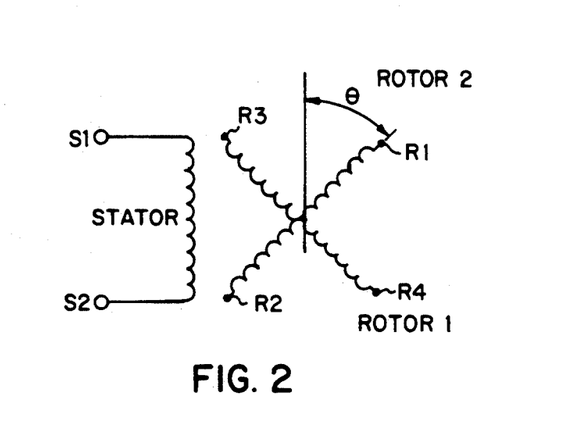
FIG. 2 is a schematic illustration of one type of resolver producing quadrature signals according to the prior art.

Referring to FIG. 2, there is shown a schematic diagram of one type of resolver. At least one stator winding is fixed relative to a rotor carrying two windings that are at right angles. If a voltage signal $A \cdot \sin(\omega t)$ is applied across terminals S1 and S2 of the stator windings, the voltage signal across terminals R1 and R2 of the first rotor winding is $A \cdot \sin(\omega t) \sin\theta$ and the signal across terminals R3 and R4 of the second rotor winding is $A \cdot \sin(\omega t) \cos\theta$. Here $\theta$ is the mechanical displacement of the rotatable shaft and $A\sin(\omega t)$ is the stator excitation voltage.

In all quadrature encoding systems, the quadrature signals should be free of scale factor, phase and bias errors at the input to the quadrature encoder. Amplitude errors (dks and dkc) and bias errors (So and Co) are those errors that are the result of fundamental transducer gain imbalance and signal processing gain differences between channels. Spatial phase error ($\phi$) can be introduced by the basic construction of the transducer (first and second rotor windings in the resolver of FIG. 2 that are not perfectly orthogonal, for example). This error can also be caused by differential impedance characteristics of the two channels. If these errors exist, then the resulting encoded angular or linear displacement information will be in error.

The prior art techniques for minimizing the errors in the quadrature signals comprise: 1) matched channel gains to minimize gain error, 2) low offset amplifiers to reduce bias, 3) ac coupling to reduce bias, 4) system calibration, and 5) cross channel coupling to reduce spatial quadrature errors. The present implementation of these techniques tends to increase costs, introduce other errors, and in all cases assume that the parameters do not change over time.

SUMMARY OF THE INVENTION

It is an advantage, according to this invention, to provide an adaptive system and process for correcting quadrature signal errors for amplitude, phase and bias errors, thus eliminating the need for expensive channel matching, repeated manual calibration and other time-consuming and costly techniques.

It is a particular advantage, according to this invention, that the system or process is adaptive because quadrature errors are constantly monitored and corrected.

Briefly, according to this invention, the quadrature signal errors are continuously corrected by continuously generating an error function signal E having a value equal to the sum of the squares of the normalized values of each quadrature signal (S and C) minus a reference constant, say one. The signal corresponding to the error function E at the zero crossings of the quadrature signals is saved to produce instantaneous error value signals $E(0)$, $E(\pi/2)$, $E(\pi)$, $E(3\pi/2)$, and in a preferred embodiment, the value of the error function is saved when the difference between the absolute values of the quadrature signals cross zero to produce instantaneous error value signals for $E(\pi/4)$ and $E(3\pi/4)$. These four or six instantaneous error value signals are used to produce signals corresponding to the values of the base and amplitude errors for each quadrature signal and the phase error signal as follows:

TABLE I

| | | |
|---|---|---|
| dkse = | $[E(\pi/2) + E(3\pi/2)]/2$ | (SIN channel amplitude error) |
| Soe = | $E(\pi/2) - $ dkse | (SIN channel bias error) |
| dkce = | $[E(0) + E(\pi)]/2$ | (COS channel amplitude error) |
| Coe = | $E(0) - $ dkce | (COS channel bias error) |
| $\phi 3 =$ | $E(\pi/4) - E(3\pi/4)$ | (spatial phase error) |

These quadrature error signal values are then used to construct normalized or corrected quadrature signals S and C as follows:

TABLE II

| | |
|---|---|
| S = | $[1/(1 + $ dkse$)]$ SIN $-$ Soe, and |
| C = | $[1/(1 + $ dkse$)]$ COS $- \phi$S $-$ Coe, | where SIN and COS are the actual quadrature signals produced by the SIN and CO channels.

Because errors dkse and dkce are small, the corrected quadrature signals may be constructed as follows:

TABLE IIA

| | |
|---|---|
| S = | $[1 - $ dkse$]$ SIN $-$ Soe, and |
| C = | $[1 - $ dkce$]$ COS $-$ Coe |

The corrected quadrature signals are then used to generate the next set of instantaneous error function values as follows:

$$E = S^2 + C^2 - 1 \text{ for } E(0), E(/2) \ldots$$

The system and process are iterative. The new instantaneous error function values are used in a following time interval to produce corrected quadrature signals. The corrected quadrature signals are then used to generate a new set of instantaneous error function values, etc. It has been found that a few iterations after start-up, the corrected quadrature signals stabilize substantially error-free.

The signals above described may be analog electrical signals or a combination of analog and digital electrical signals. The entire system may be implemented with analog circuit elements. In one embodiment, certain signals are digitized, manipulated with a digital circuit which may comprise a microprocessor, and thereafter returned to the analog mode by digital-to-analog converters for passing to a quadrature detector. In yet another embodiment, the quadrature detector is implemented in the microprocessor itself.

BRIEF DESCRIPTION OF THE DRAWINGS

Further features and other objects and advantages will become clear from the following detailed description made with reference to the drawings in which:

FIGS. 11(a) to 11(d) are diagrams generated by computer simulation of an error correction circuit according to this invention to illustrate correction of a SIN channel bias error, and FIGS. 12(a) to 12(k) are diagrams generated by computer simulation of an error correction circuit according to this invention to illustrate correction of all five types of quadrature error at one time.

DESCRIPTION OF THE PREFERRED EMBODIMENTS

Figure 3:
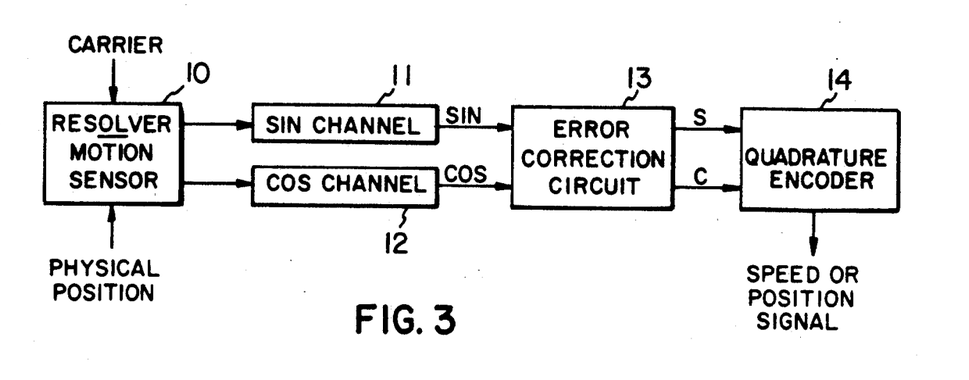
FIG. 3 is a schematic illustration showing the placement of an error correction circuit in a quadrature encoder system according to this invention.

Referring to FIGS. 1 and 3, quadrature encoder systems are shown in which a motion control sensor 10 outputs quadrature signals in response to change in the physical position of a monitored member. Other motion control sensors with which this invention might be used include optical sine wave encoders and Michelson effect laser interferometers. The motion sensor may, for example, be a resolver monitoring the rotation of a shaft. The quadrature signals are processed in separate channels 11 and 12 where they may be amplified and/or demodulated to remove the carrier frequency component of the quadrature signals. The output of the channels are uncorrected quadrature signals SIN and COS. The uncorrected quadrature signals may contain amplitude, phase and bias errors. As shown in FIG. 1 representative of the prior art, the uncorrected quadrature signals are applied to the quadrature decoder 14.

Referring now only to FIG. 3, the uncorrected quadrature signals are removed by the applicant's novel error correction method and circuit 13 and the corrected quadrature signals S and C are applied to the quadrature encoder 14. The quadrature encoder 14 may be any of those commonly used to produce speed and/or position signals. The applicant's invention resides in the improved system and method for correcting the quadrature errors in the error correction circuit 13.

Figure 4:
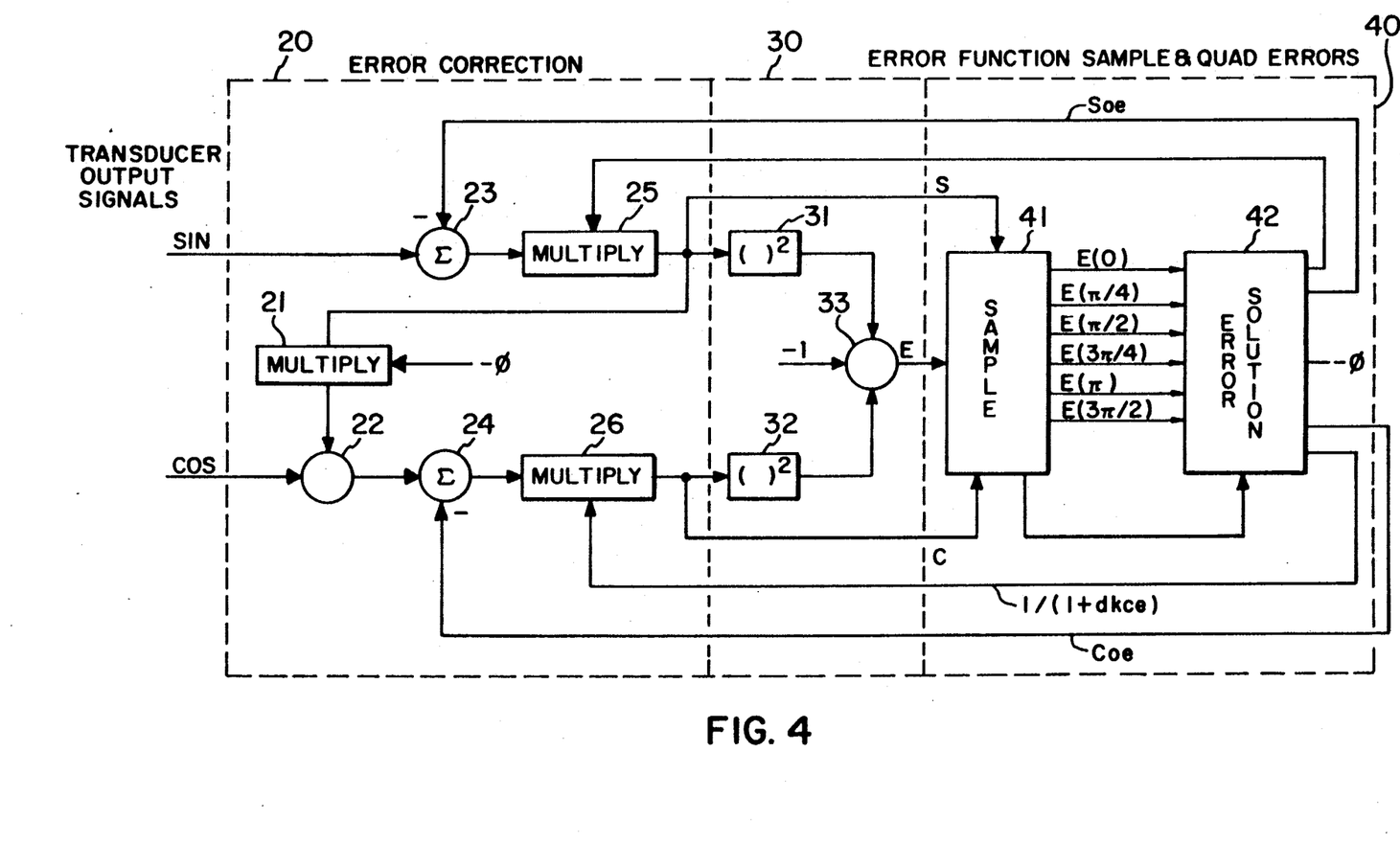
FIG. 4 is a detailed function diagram illustrating the flow of information signals and the processing of those signals in the error correction circuit according to this invention.

Referring to diagram FIG. 4, the uncorrected quadrature signals SIN and COS are applied to an error correction circuit. The error correction circuit comprises three sections: error correction section 20, error function generation section 30, and sample and quadrature error computation section 40.

In the error correction section 20, the uncorrected quadrature signals are corrected using the instantaneous estimates of quadrature errors dkse, dkce, Soe, Coe and $\phi e$ derived in the quadrature error computation section 40. Of course, at start-up of this iterative system and method, the estimated errors will all be zero.

The phase error may be corrected using the negative of the phase error and the cosine addition law: $\cos(\theta + (-\phi e)) = \cos\theta\cos(-\phi e) - \sin\theta\sin(-\phi e)$. Since, the phase error will be near zero, it can be assumed that the $\cos \phi e$ is equal to one and $\sin \phi e \approx \phi e$. Thus, $\cos(\theta - \phi e)$ is approximated by $\cos\theta + \theta e \sin\phi$. Hence, a multiplication operation 21 and an addition operation 22 on the quadrature signals will correct for phase error.

The bias errors Coe and Soe can be corrected by subtracting (reversing the sign and adding) the estimated bias errors Coe and Soe errors from their respective quadrature signals. Thus, two addition operations 23, 24 are required.

The amplitude errors dks and dkc can be corrected by multiplying each quadrature signal by the inverse of (1+dkse) or (1+dkce), respectively. Thus, two multiplication operations 25 and 26 are required.

The normalized or corrected quadrature signals S and C are used in the error function section 30 where they are squared in multiplication operations 31 and 32. The squared signals are added together and a reference constant, for example 1, is subtracted from the sum to produce e the error function signal E in an addition operation 33.

The corrected quadrature signals S and C and the error function signal are then applied to the quadrature error computation section 40.

The estimated quadrature error signals are established by sampling the corrected S and C signals (uncorrected on the first iteration) at $\theta = 0$, $\pi/4$, $\pi/2$, $3\pi/4$, $\pi$, $3\pi/2$. The zero crossings of the corrected quadrature signals or functions thereof are used to sample the error function even though these signals are in error until after several iterations. This is possible because, as will be demonstrated, all combinations of quadrature errors will converge to zero with this system and method.

The sampled error function signals are applied to the error solution circuit 42 where they are operated upon to produce the signals 1/(1+dkse), 1/(1+dkce), −Soe, −Coe, and −$\phi e$ by manipulating the sampled error function signals according to the equations set forth in Table I.

Figure 5:
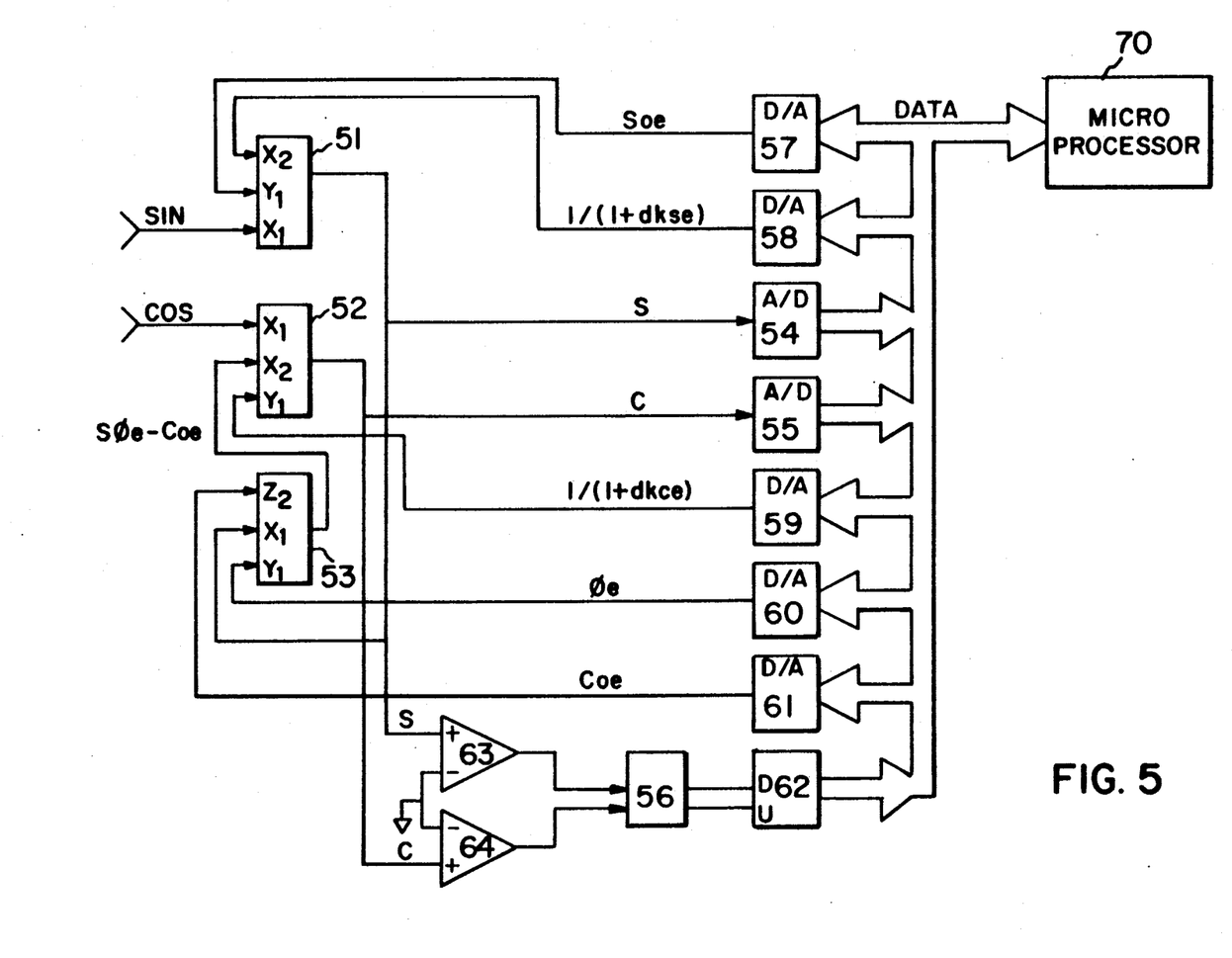
FIG. 5 is a schematic diagram for illustrating how the system and method according to this invention could be implemented with analog and digital circuit elements including a microprocessor.

Referring now to FIG. 5, there is shown schematically an embodiment in which signals are processed with both analog and digital signal processing technology. The analog portion of the circuit performs the normalization or correction of the SIN and COS signals using the estimated error signals calculated by a microcontroller 51.

The raw SIN and COS signals are applied to analog signal multipliers 51 and 52, respectively. These signals will be mathematically equivalent to $$SIN = (1 + dks) \sin(\theta) + So, \text{ and}$$

$$COS = (1 + dkc) \cos(\theta + \phi) + Co.$$

The analog multipliers may comprise AD734 integrated circuits from Analog Devices or equivalent. These circuits have the following input/output relationship:

$$Vout = (X1 - X2)(Y1 - Y2)/K + Z1 + Z2$$

where X1, X2, Y1, Y2, Z1, and Z2 are user defined inputs and K is a user defined gain.

Applying SIN, Soe and $1/(1+dkse)$ to inputs X1, X2 and Y1, respectively, of analog multiplier 51 and setting the gain K equal to 1 and letting the other inputs equal zero, Vout is then of the following form:

$$Vout = [(1 + dks) \sin(\theta) + So - Soe][1/(1 + dkse)].$$

As dkse approaches dks and So approaches Soe, then Vout approaches $\sin(\theta)$ which is the corrected sine signal S.

Applying corrected sine signal S, the estimated phase error $\phi e$, and $1/(1+dkce)$ to inputs X1, Y1 and Z2, respectively, of analog multiplier 53 and setting the gain to 1 and the remaining inputs to zero, the Vout is then of the following form:

$$Vout = S(\phi e) + Coe.$$

Applying COS, the output of analog multiplier 53, and $1/(1+dkce)$ to inputs X1, X2 and Y1, respectively, of analog multiplier 52, the Vout is then of the following form:

$$Vout = [COS + S(\phi e) - Coe][1/(1 + dkce)].$$

Considering that $COS = (1 + dkc)\cos\theta - \phi\sin\theta + Co$, as $\phi e$ approaches $\phi$, S approaches $\sin(\theta)$, Coe approaches Co and dkce approaches dkc, then COS approaches $\cos\theta$ which is the corrected cosine signal C.

Digital-to-analog converters 57, 58, 59, 60 and 61 convert the digital estimated error signals to analog signals for application to the respective analog multipliers 51, 52, and 53. Analog-to-digital converters 54 and 55 digitize the corrected quadrature signals S and C for input to the microprocessor 70, for example, a Motorolla 56001 Digital Signal Processor where the estimated error signals are digitally computed. The sampling rate of S and C can be adjusted as required.

The integer number of complete spatial cycles may be tracked by feeding the normalized sine and cosine signals S and C into comparators 63 and 64. The outputs of the comparators are square waves whose output is "on" when their respective inputs are greater than zero. The square waves are input to decoder 56 which decodes each up/down pulse corresponding to a complete spatial cycle with $\theta$ from 0 to $2\pi$ generating an up pulse and $\theta$ with from $2\pi$ to 0 generating a down pulse. These pulses are input to counter 62 which then tracks the number of completed spatial cycles. In this manner, the position n of an electro/mechanical system, coupled to the transducer that produces the quadrature signals SIN and COS, can be determined. This is a simple implementation of a quadrature decoder. Much more precise encoders are known and used. This invention is particularly suitable with precision encoders.

Figure 6:
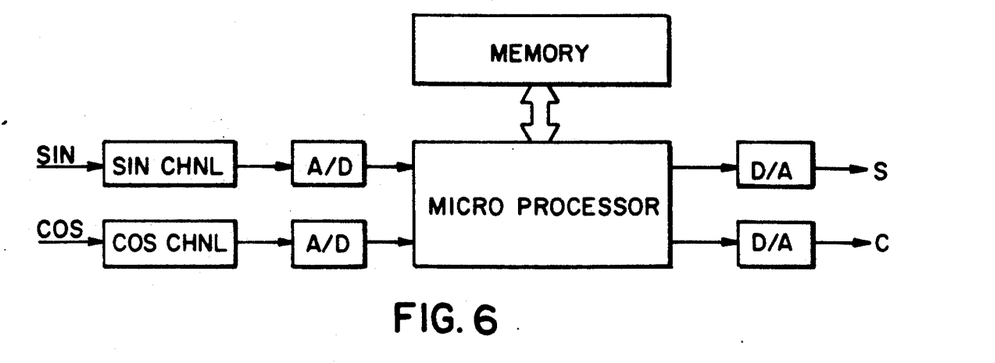
FIG. 6 is a schematic diagram for illustrating how the system and method according to this invention could be implemented substantially entirely with microprocessor and/or microcontroller technology.

An alternate embodiment is suggested in FIG. 6 in which all of the corrections are made within the digital signal processor. The uncorrected quadrature signals are digitized by analog-to-digital converters and the corrected quadrature signals are output through digital-to-analog converters. It may not be necessary to generate corrected signals in analog form where the functions of the quadrature encoder are performed within the digital signal processor itself.

Figure 7:
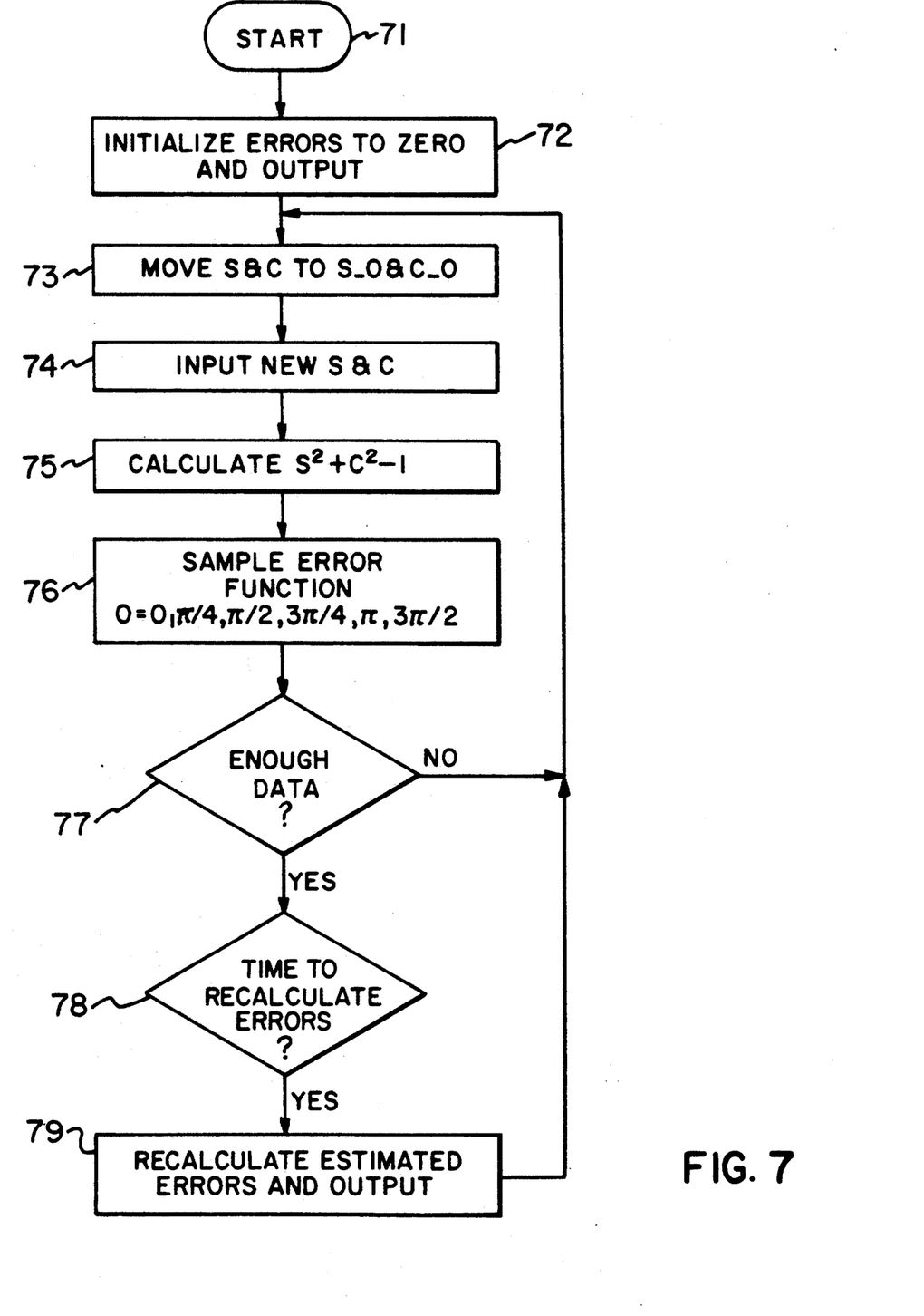
FIG. 7 is a flow diagram to illustrate the programming to control the microprocessor shown in FIG. 5.

Referring to FIG. 7, there is shown a flow diagram of the computer program executed by the digital signal processor. The program is entered at 71 and at 72 the estimated error values are initialized to zero and output to the digital-to-analog converters 57 to 61 (FIG. 5). At 73, the old values of S and C are saved in S_O and C_O, respectively. Next at 74, the digitized values of C and S are input and at 75 the error function calculated. The error is sampled at 76. The sampling times are determined by reference to the present values of S and C even though these may not yet be corrected for the quadrature errors present in SIN and COS. As will be shown, the estimated error values converge to the correct values after several iterations no matter the combination of quadrature errors. The sampling times are determined from conditionally testing C and S or functions thereof for zero crossing as follows:

TABLE III

| | |
|---|---|
| cross 0 | when S * S_O is negative & C is positive |
| cross $\pi/2$ | when C * C_O is negative & S is positive |
| cross $\pi$ | when S * S_O is negative & C is negative |
| cross $3\pi/2$ | when C * C_O is negative & S is negative |
| cross $\pi/4$ | when (C + S) * (C_O + S_O) is negative & (C − S) is positive |
| cross $3\pi/4$ | when (C − S) * (C_O − S_O) is negative & (C + S) is positive |

A test for all required samples (enough data) is made at 77. If all samples have not been gathered, the procedure loops back to 74. If enough data has been gathered, a test is made to determine if sufficient time has passed to recalculate the estimated errors at 78. If yes, then the estimated errors are recalculated at 79 using the formulas in Table I and the new estimated errors are output to the digital-to-analog converters 59 to 64.

Figure 8:
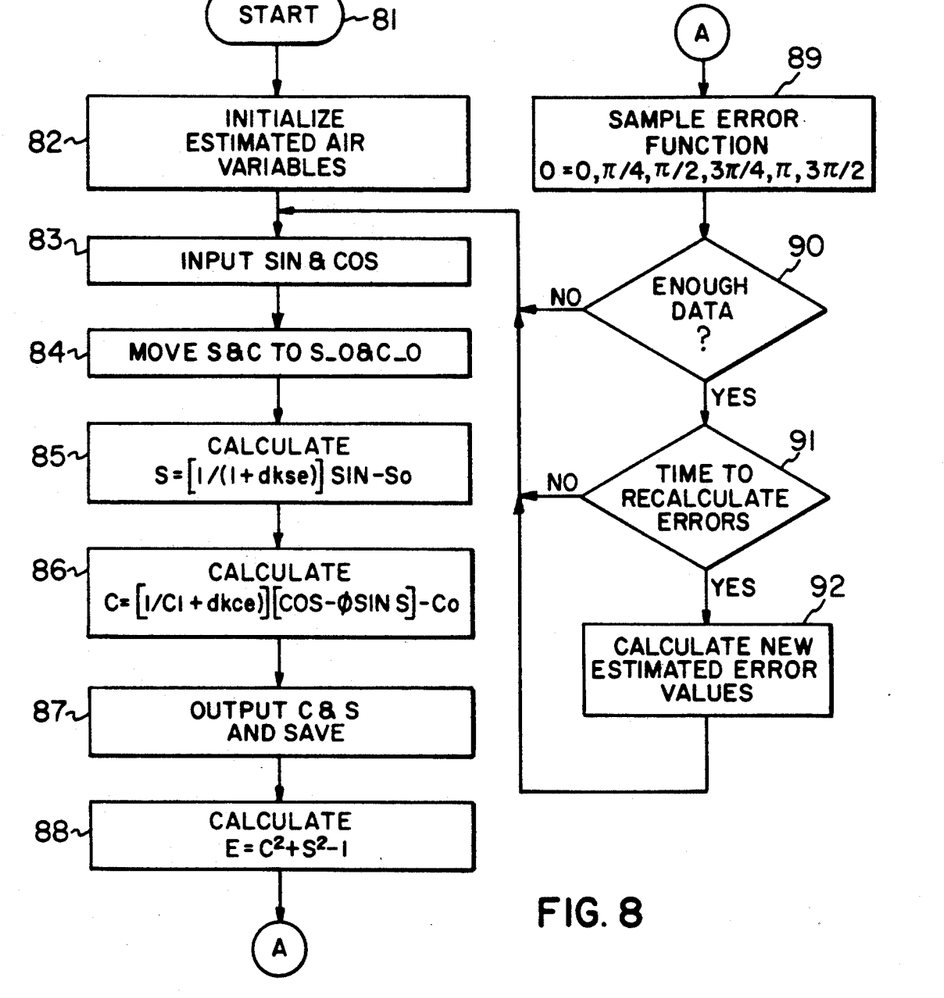
FIG. 8 is a flow diagram to illustrate the programming to control the microprocessor shown in FIG. 6, FIGS. 9(a) to 9(d) are diagrams generated by computer simulation of an error correction circuit according to this invention to illustrate the correction of phase error.
Figure 9A:
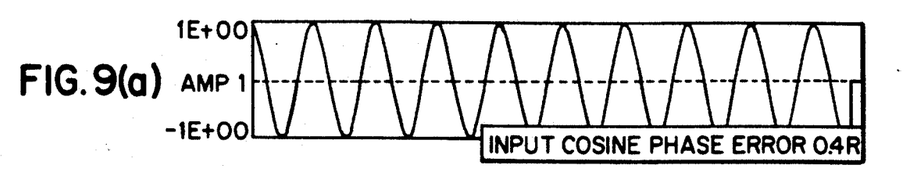
Figure 9B:
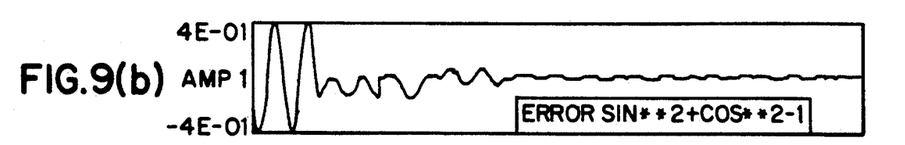
Figure 9C:
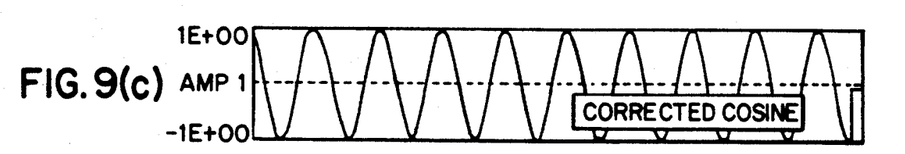
Figure 9D:
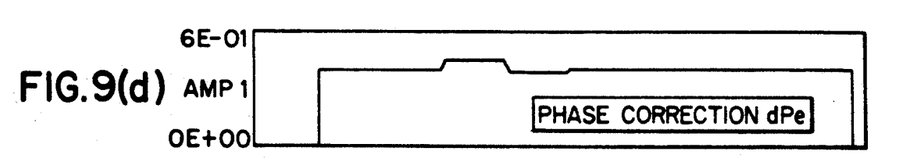
Figure 10A:
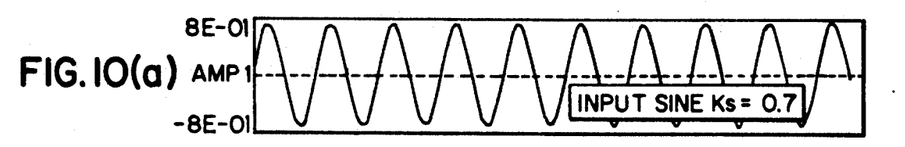
FIGS. 10(a) to 10(d) are diagrams generated by computer simulation of an error correction circuit according to this invention to illustrate the correction of SIN channel amplitude error (scale factor error)
Figure 10B:
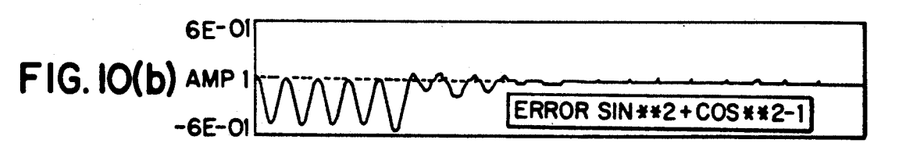
Figure 10C:
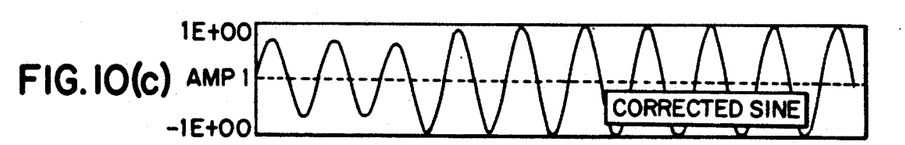
Figure 10D:
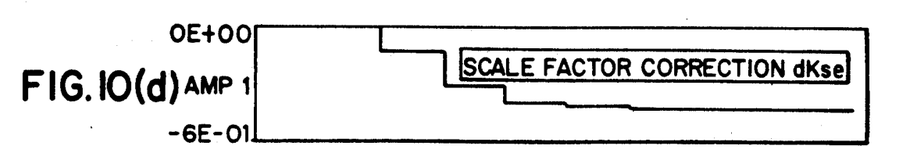
Figure 11A:
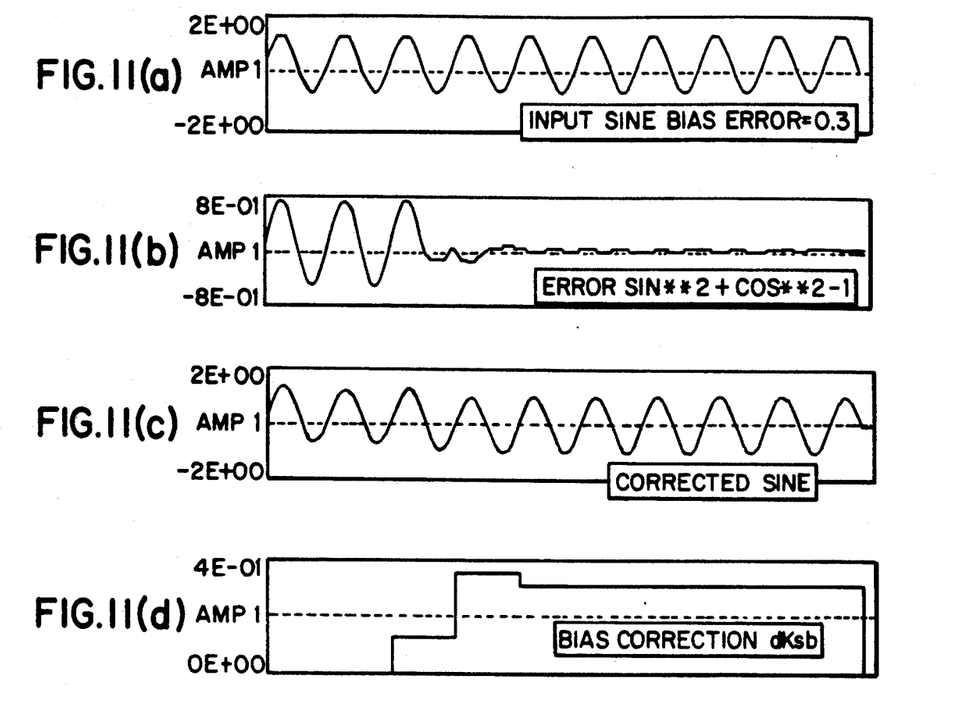
Figure 12A:
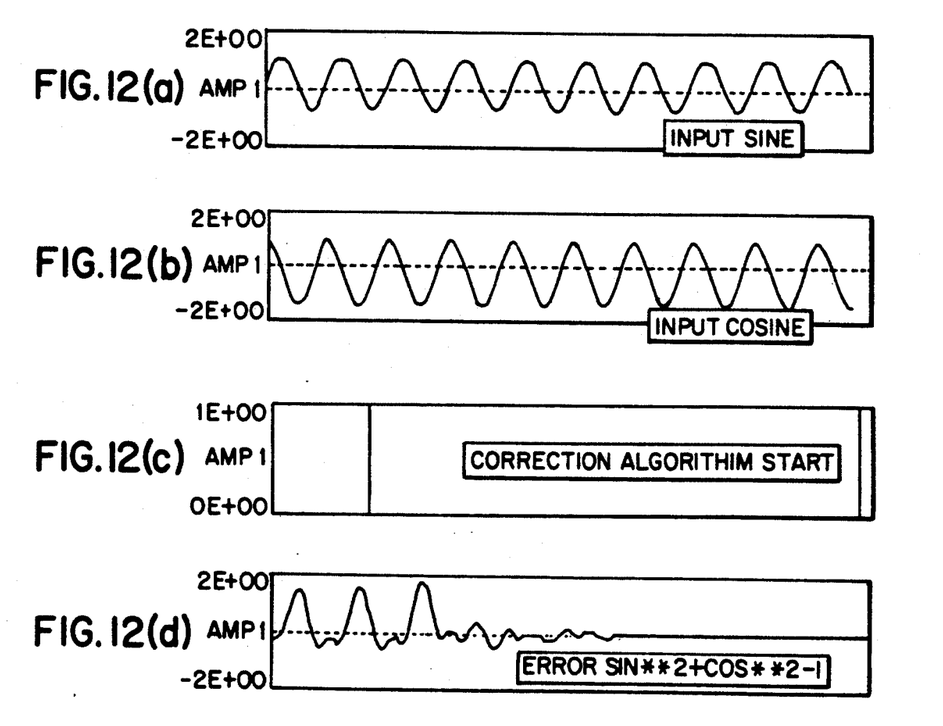
Figure 12E:
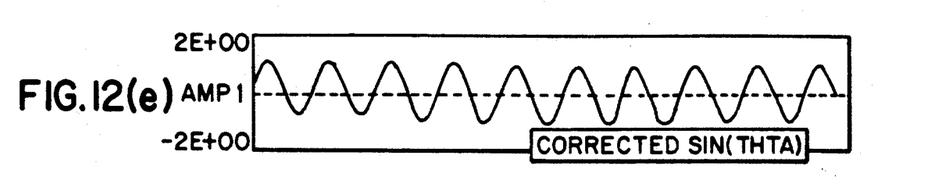
Figure 12F:
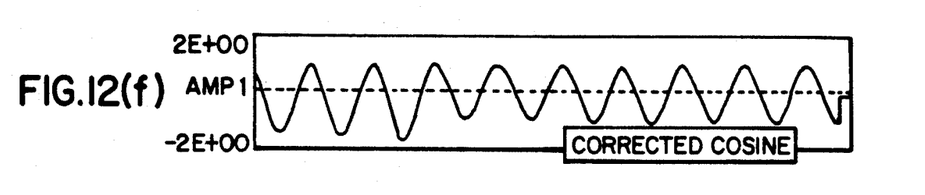
Figure 12G:
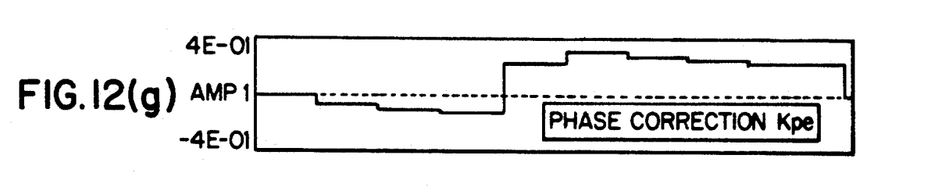
Figure 12H:
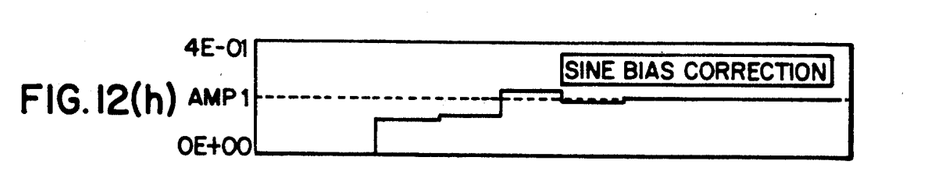
Figure 12I:
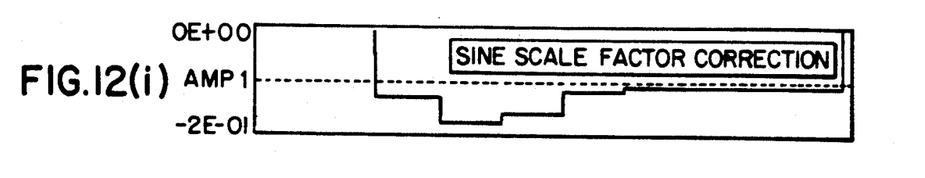
Figure 12J:
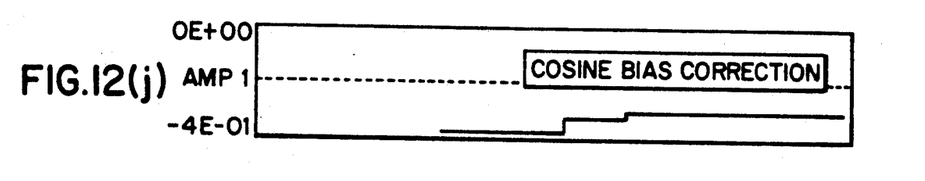
Figure 12K:
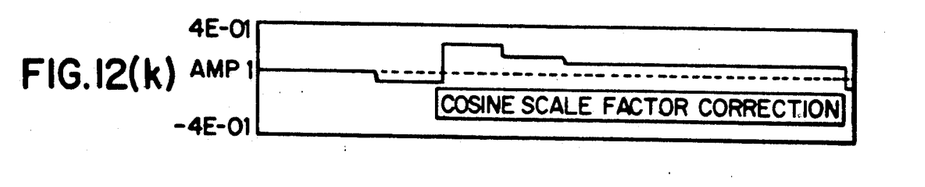

Referring to FIG. 8, there is shown a flow diagram for a computer program for the digital signal processor shown in FIG. 6. The program is entered at 81. The estimated error values are initialized at 82. At 83, the digitized values of SIN and COS are input. At 83, the old values of S and C are saved in S_O and C_O, respectively. At 85, a new normalized value of S is calculated. At 86, a new normalized value of C is calculated. At 87, the values of S and C are saved, output for converting to analog signals to be passed to the quadrature detector. The values may simply pass along to another program in the same computer which implements the quadrature detector. Blocks 88 to 92 are identical to blocks 75 to 79 in FIG. 7.

The processes and systems according to this invention have been mathematically simulated. Referring to FIGS. 9(a) to 9(d), there is shown how a transient cosine channel phase error of 0.4 radians is caused to be corrected. The correction is initiated at t=5 seconds. The phase correction stabilizes with three cycles of the of the reference cosine. FIGS. 10(a) to 10(d) illustrate the correction of a sine channel amplitude error of 30 percent full scale. The correction is initiated at t=5 seconds. The amplitude error correction stabilizes after three cycles. FIGS. 11(a) to 11(d) illustrate the correction of a sine channel bias error of 30 percent full scale. Again the corrections are complete within three cycles. FIGS. 12(a) to 12(k) illustrates the correct of all five quadrature errors; namely, a phase error of 0.2 radians, sine channel amplitude error of 0.9 full scale, sine channel bias error of 0.2 full scale, cosine channel amplitude error of 0.2 full scale and a cosine channel bias error of minus 0.3 full scale. The correction began at t=5 seconds and was complete for all errors within four cycles.

Having thus defined my invention in the detail and particularity required by the Patent Laws, what is desired to be protected by Letters Patent is set forth in the following claims.

I claim:

1. A method of encoding the position of an element comprising generating electrical quadrature signals (SIN and COS) the frequency of which is indicative of the rate of change of position of the element and the lead-lag relationship of which is indicative of the direction of change of position and correcting quadrature signal errors dks, so, dkc, and Co in [two electrical] said signals where $SIN=(1+dks)\sin(\theta)+So$ and $COS=(1+dkc)\cos(\theta)+Co$ and wherein dks and dkc represent amplitude errors and So and Co represent bias errors comprising the steps for:
   a) generating an error function signal E by summing the squares of the signals SIN and COS and subtracting a constant K therefrom,
   b) saving the value of the error function E at $\theta$ equals approximately 0, $\pi/2$, $\pi$, ad $3\pi/2$,
   c) generating signals indicative of the quadrature errors as follows:

$dkse = [E(\pi/2) + E(3\pi/2)]/2$,
   $Soe = E(\pi/2) - dkse$,
   $dkce = [E(0) + E(\pi)]/2$,
   $Coe = E(0) - dkce$, d) generating corrected quadrature signals S and C by processing the signals SIN and COS as follows:

$S=[1/(1+dkse)]\ SIN-Soe$, and $C+[1/(1+dkse)]\ COS-Coe$, and e) encoding the quadrature signals into position signals.

2. The method of claim 1 wherein steps a) to d) are repeated substituting signals S and C for SIN and COS respectively in step a) to produce a new set of corrected quadrature signals S and C.

3. The method of claim 2 wherein the steps therein are repeated until at the end of an iteration the error function E has a value below a preselected threshold.

4. The method of claim 2 wherein the steps therein are repeated continually at spaced intervals.

5. A method of encoding the position of an element comprising generating electrical quadrature signals (SIN and COS) the frequency of which is indicative of the rate of change of position of the element and the lead-lag relationship of which is indicative of the direction of change of position and correcting quadrature signal errors dks, So, dkc, Co and $\phi$ in said signals where $SIN=(1+dks)\sin(\theta)+So$ and $COS=(1+dkc)\cos(\theta+\phi)+Co$ and wherein dks and dkc represent amplitude errors and So and Co represent bias errors comprising the steps for:
   a) generating an error function signal E by summing the squares of the signals SIN and COS and subtracting a constant K therefrom,
   b) saving the value of the error function E at $\theta$ equals approximately 0, $\pi/4$, $\pi/2$, $3\pi/4$, $\pi$, and $3\pi/2$,
   c) generating signals indicative of the quadrature errors as follows:

$dkse = [E(\pi/2) + E(3\pi/2)]/2$,
   $Soe = E(\pi/2) - dkse$,
   $dkce = [E(0) + E(\pi)]/2$,
   $Coe = E(0) - dkce$,
   $\phi e = E(\pi/4) - E(3\pi/4)$, d) generating corrected quadrature signals S and C by processing the signals SIN and COS as follows:

$S=[1/(1+dkse)]\ SIN-Soe$, and $C=[1/(1+dkse)]\ COS-\phi es-Coe$, and e) encoding the quadrature signals into position signals.

6. The method of claim 5 wherein steps a) to d) are repeated substituting signals S and C for SIN and COS respectively in step a) to produce a new set of corrected quadrature signals S and C.

7. The method of claim 6 wherein the steps therein are repeated until at the end of an iteration the error function E has a value below a preselected threshold.

8. The method of claim 7 wherein the steps therein are repeated continually at spaced intervals.

9. A system of encoding the position of an element comprising generating electrical quadrature signals (SIN and COS) the frequency of which is indicative of the rate of change of position of the element and the lead-lag relationship of which is indicative of the direction of change of position and correcting quadrature signal errors dks, So, dkc, and Co in said signals where $SIN=(1+dks)\sin(\theta)+So$ and $COS=(1+dkc)\cos(\theta)+Co$ and wherein dks and dkc represent amplitude errors and So and Co represent bias errors comprising:
   a) circuit means for generating an error function signal E by summing the squares of the signals SIN and COS and subtracting a constant C therefrom,
   b) circuit means for saving the value of the error function E at $\theta$ equals approximately 0, $\pi/2$, $\pi$, and $3\pi/2$,
   c) circuit means for generating signals indicative of the quadrature errors as follows:

$dkse = [E(\pi/2) + E(3\pi/2)]/2$,
   $Soe = E(\pi/2) + dkse$,
   $dkce = [E(0) + E(\pi)]/2$,
   $Coe = E(0) + dkce$, d) circuit means for generating corrected quadrature signals S and C by processing the signals SIN and COS as follows:

$S = [1/(1+dkse)] \text{ SIN} - Soe$, and $C = [1/(1+dkse)] \text{ COS} - Coe$, and e) circuit means for encoding the quadrature signals into position signals.

10. The system according to claim 9 wherein the circuit means comprise a combination of analog and digital circuit elements.

11. The system according to claim 10 wherein the digital circuit elements include a microcomputer or digital signal processor.

12. A system of encoding the position of an element comprising generating electrical quadrature signals (SIN and COS) the frequency of which is indicative of the rate of change of position of the element and the lead-lag relationship of which is indicative of the direction of change of position and correcting quadrature signal errors dks, So, dkc, Co and in said signals where $\text{SIN} + (1+dks)\sin(\theta) + So$ and $\text{COS} = (1+dkc)\cos(\theta+\phi) + Co$ and wherein dks and dkc represent amplitude errors and So and Co represent bias errors comprising:

a) circuit means for generating an error function signal E by summing the squares of the signals SIN and COS and subtracting a constant C therefrom, b) circuit means for generating an error function signal E by summing the squares of the signals SIN and COS and subtracting a constant C therefrom, b) circuit means for saving the value of the error function E at $\theta$ equals approximately 0, $\pi/4$, $\pi/2$, $3\pi/4$, $\pi$ and $3\pi/2$, c) circuit means for generating signals indicative of the quadrature errors as follows:

$dkse = [E(\pi/2) + E(3\pi/2)]/2$,
$Soe = E(\pi/2) - dkse$,
$dkce = [E(0) + E(\pi)]/2$,
$Coe = E(0) - dkce$,
$\phi e = E(\pi/4) - E(3\pi/4)$, d) circuit means for generating corrected quadrature signals S and C by processing the signals SIN and COS as follows:

$S = [1/(1+dkse)] \text{ SIN} - Soe$, and $C = [1/(1+dkse)] \text{ COS} - \phi es - Coe$, and e) circuit means for encoding the quadrature signals into position signals.

13. The system according to claim 12 wherein the circuit means comprise a combination of analog and digital circuit elements.

14. The system according to claim 13 wherein the digital circuit elements include a microcomputer or digital signal processor.

* * * * *

UNITED STATES PATENT AND TRADEMARK OFFICE
CERTIFICATE OF CORRECTION

PATENT NO. : 5,134,404
DATED : July 28, 1992
INVENTOR(S): Robert A. Peterson It is certified that error appears in the above-identified patent and that said Letters Patent is hereby corrected as shown below:

Column 2 Line 47 "CO" should read --COS--.

Column 4 Line 34 "$\theta$ esin $\phi$" should read --$\phi$ esin $\theta$--.

Claim 1 Line 35 Column 7 delete "[two electrical]".

Claim 1 Line 44 Column 7 "ad" should read --and--.

Claim 1 Line 58 Column 7 "C+" should read --C=--.

Claim 12 Line 6 Column 10 "$\Pi$ and" should read --$\Pi$, and--.

Signed and Sealed this

Twenty-fourth Day of August, 1993

*Attest:*

BRUCE LEHMAN

*Attesting Officer*     *Commissioner of Patents and Trademarks*